United States Patent [19]

Chen et al.

[11] Patent Number: 5,120,475
[45] Date of Patent: Jun. 9, 1992

[54] METHOD FOR PREPARING MICROCAPSULES HAVING IMPROVED PRE-WALLS, AND MICROCAPSULES AND PHOTOSENSITIVE MATERIALS PRODUCED THEREBY

[75] Inventors: Jing-Den Chen, Spring Valley; Kerry Kovacs, Centerville; M. Teresa Thomas, Medway; Rong-Chang Liang, Centerville, all of Ohio

[73] Assignee: The Mead Corporation, Dayton, Ohio

[21] Appl. No.: 510,920

[22] Filed: Apr. 19, 1990

Related U.S. Application Data

[63] Continuation-in-part of Ser. No. 450,709, Dec. 14, 1989.

[51] Int. Cl.$^5$ ............................................. B01J 13/18
[52] U.S. Cl. .................................. 264/4.7; 428/321.5; 428/320.2; 430/138; 514/911; 252/311
[58] Field of Search ................. 252/316, 311; 264/4.7; 428/302.2, 321.5; 430/138; 514/911

[56] References Cited

U.S. PATENT DOCUMENTS

| | | | |
|---|---|---|---|
| 3,796,669 | 3/1974 | Kiritani | 252/316 |
| 4,193,889 | 3/1980 | Baatz et al. | 252/316 |
| 4,353,809 | 10/1982 | Hoshi et al. | 252/316 |
| 4,546,165 | 10/1985 | Grögler et al. | 528/53 |
| 4,594,370 | 6/1986 | Adkins | 523/208 |
| 4,608,330 | 8/1986 | Marabella | 430/138 |
| 4,962,010 | 10/1990 | Colyer et al. | 430/138 |
| 4,977,060 | 12/1990 | Liang et al. | 430/138 |
| 4,985,484 | 1/1991 | Yoshida et al. | 524/379 |

*Primary Examiner*—Richard D. Lovering
*Assistant Examiner*—N. Bhat
*Attorney, Agent, or Firm*—Thompson, Hine and Flory

[57] ABSTRACT

A method for preparing microcapsules which comprises:

dispersing a hydrophobic oily liquid containing a pre-wall former in a continuous aqueous phase, the aqueous phase containing a chain extender which comprises a water soluble polyfunctional compound capable of reacting with the pre-wall former upon dispersion of the hydrophobic oily liquid in the continuous aqueous phase; and forming capsule walls around the droplets of the hydrophobic oily liquid in the continuous aqueous phase.

22 Claims, No Drawings

METHOD FOR PREPARING MICROCAPSULES HAVING IMPROVED PRE-WALLS, AND MICROCAPSULES AND PHOTOSENSITIVE MATERIALS PRODUCED THEREBY

CROSS-REFERENCE TO RELATED APPLICATION

This application is a continuation-in-part of U.S. application Ser. No. 07/450,709, filed Dec. 14, 1989.

BACKGROUND OF THE INVENTION

1. Field of the Invention

The present invention relates to an improved method for producing microcapsules and, more particularly, to a method for producing microcapsules in which the wall is formed from an amine-formaldehyde condensation product. While the method of the present invention is useful in producing microcapsules generally, microcapsules prepared in accordance with the present invention are particularly useful in photosensitive imaging materials of the type which employ a layer of microcapsules containing a radiation sensitive composition.

2. Brief Description of the Prior Art.

Imaging materials employing photosensitive microcapsules are the subject of commonly assigned U.S. Pat. Nos. 4,399,209 and 4,440,836.

In the aforesaid commonly assigned U.S. patents, images are formed by image-wise exposing a layer of photosensitive capsules to actinic radiation and rupturing the capsules typically by passing the imaging sheet containing the capsules through a pressure nip. The radiation sensitive composition contains a photohardenable or photosoftenable material which undergoes a change in viscosity or modulus upon exposure. For example, in the most typical embodiments, the radiation sensitive composition contains a polyethylenically unsaturated monomer which polymerizes upon exposure, thereby causing the internal phase of the capsules to become harder. Due to the difference in the hardness of the capsules in the exposed versus the unexposed areas, only certain capsules rupture and release their contents. If the internal phase contains a dye precursor, the precursor is image-wise released, and a color image is formed upon its transfer to a developer layer. In previously disclosed embodiments, the developer layer may be present on the same support as the layer of capsules or a separate support.

As a microcapsule wall material, amine-formaldehyde polymers, and more particularly, melamine-formaldehyde polymers, have been used to encapsulate the photosensitive internal phase. For example, U.S. Pat. No. 4,608,330 discloses the encapsulation of photosensitive materials of the types described above in melamine-formaldehyde capsules. The process for preparing the microcapsules typically involves forming an emulsion of an oily internal phase composition in an aqueous phase, and enwrapping particles of the internal phase in an amine-formaldehyde condensation product produced by in situ condensation of melamine and formaldehyde. This patent also discloses that a polyisocyanate may be added to the oily internal phase composition. The isocyanate forms a polymer pre-wall around the internal phase upon introduction into the phase.

Similarly, U.S. Pat. No. 4,353,809 microcapsules with melamine-formaldehyde or urea-formaldehyde capsule shell walls. The reference also teaches the addition of a polyvalent isocyanate, a polyvalent isothiocyanate or a prepolymer thereof to the internal phase prior to addition to the aqueous phase to form a non-sticky pre-wall material around the internal phase during the emulsification step. The presence of the isocyanate, isothiocyanate, or prepolymer functions to stabilize the emulsion and enable the production of small diameter microcapsules.

Although the above microencapsulation processes have proven to be of great importance, they still suffer from one or more drawbacks.

For example, the polycondensation of the isocyanate groups in forming the polyurea pre-wall takes a relatively long time, and any reaction which occurs is confined to the oil-water interface. It is believed that as soon as a thin shell of a pre-wall is formed, pre-wall formation stops. It would be desirable for this reaction to continue to form a thicker pre-wall, particularly when the microcapsules are used in photosensitive materials.

When the internal phase of the microcapsules contains a photosensitive composition, other problems must be considered. Free radical initiated reactions are generally relied upon to change the physical characteristics of the microcapsules making them useful in the formation of images. These free radical reactions are inhibited by oxygen. The microcapsule walls function as a barrier to prevent oxygen from infiltrating the photosensitive composition. Upon exposing the material to actinic radiation, free radicals consume the oxygen present in the composition and reactions proceed. If oxygen readily reinfiltrates the composition, the photographic speed of the material is very poor.

It has been found that the microcapsule walls should be water resistant. It is believed water can plasticize the wall material and reduce the wall's barrier properties. If the barrier properties are reduced, the amount of oxygen diffusion will increase and, in turn, the photographic efficiency of the internal phase will significantly decrease. Previous microcapsules, although generally effective, tend to lose their photographic speed when they are stored under high temperature, high humidity conditions.

Accordingly, there exists a need in the art for microcapsules having improved high temperature/high humidity characteristics (e.g., 30° C./80% RH).

SUMMARY OF THE INVENTION

In accordance with the present invention, microcapsules are prepared by dispersing a hydrophobic, oily liquid containing a pre-wall former in a continuous aqueous phase and subsequently forming polymeric walls around the dispersed internal phase. The invention is particularly characterized by the addition of a chain extender to the aqueous phase to increase the pre-wall formation rate. The chain extender is believed to react with the polyisocyanate (or other pre-wall former) to provide a thicker, less permeable pre-wall. It also provides a better adhesion between the pre-wall and the outer polymeric wall, and thus provides microcapsules with better humidity and temperature resistance.

DETAILED DESCRIPTION OF THE INVENTION

In the present invention a hydrophobic oily liquid containing a pre-wall former is dispersed in a continuous aqueous phase to form a dispersion wherein said pre-wall former forms a thin non-sticky pre-wall around the dispersed oily liquid to form distinct droplets. Capsule walls are then formed around the individual droplets to form microcapsules. The present invention resides in the use of a water soluble chain extender, which also has a high affinity toward the internal phase, in the aqueous phase of the dispersion to improve the formation of the pre-wall and the stability of the microcapsules.

In copending application, U.S. Ser. No. 07/450,709, filed Dec. 14, 1989, the particular chain extenders of choice are oil soluble but have high affinity toward the aqueous phase and are added to the oily liquid phase prior to dispersion in the aqueous phase. In that application the chain extender reacts with the pre-wall former to thicken the pre-wall from the inside.

In accordance with the present invention, the chain extenders are selected from those which are soluble in the aqueous phase. By having the chain extender in the aqueous phase, it is available to react with the pre-wall former to thicken the pre-wall from the outside of the pre-wall. In addition to having a more precise control over the thickness of the pre-wall, it is believed that the present chain extenders also act as a catalyst to increase the rate of formation of the pre-wall. It is further believed that the chain extenders react with both the pre-wall and the cell wall to form a bridge and provide better adhesion between the two walls, thus providing for a more stable microcapsule having improved shelf life.

Accordingly, one embodiment of the present invention provides an improved method for preparing microcapsules which comprises:

dispersing a hydrophobic oily liquid containing a pre-wall former selected from the group consisting of a polyvalent isocyanate, a polyvalent isothiocyanate, a polyvalent isocyanate adduct, a polyvalent isothiocyanate adduct, a cyanoacrylate, or an isocyanato acrylate, in a continuous aqueous phase, said continuous aqueous phase containing a chain extender; said chain extender being a polyfunctional compound which is capable of reacting with said pre-wall former to form a pre-wall around the droplets of hydrophobic oily liquid in said continuous aqueous phase; and forming capsule walls around the droplets of said hydrophobic oily liquid in said continuous aqueous phase.

In accordance with a preferred embodiment of the invention, the pre-wall former is a polyvalent isocyanate or a mixture of a polyvalent isocyanate and a sulfonated adduct of a polyvalent isocyanate.

Representative examples of polyisocyanates and polyisothiocyanates useful in the present invention include m-phenylenediisocyanate, p-phenylenediisocyanate, 2,6-tolylenediisocyanate, 2,4-tolylenediisocyanate (TDI), naphthalene-1,4-diisocyanate, diphenylmethane-4,4'-diisocyanate, 3,3'-dimethoxy-4,4'-biphenyldiisocyanate, 3,3'-dimethylphenylmethane-4,4'-diisocyanate, xylylene-1,4-diisocyanate, xylylene-1,3-diisocyanate, 4,4-diphenylpropanediisocyanate, trimethylenediisocyanate, hexamethylenediisocyanate (HDI), biurets of HDI, propylene-1,2-diisocyanate, butylene-1,2-diisocyanate, ethylidinediisocyanate, cyclohexylene-1,2-diisocyanate, cyclohexylene-1,4-diisocyanate, p-phenylenediisothiocyanate, xylylene-1,4-diisothiocyanate, ethylidineisothiocyanate and the like; triisocyanates such as 4,4',4''-triphenylmethanetriisocyanate, toluene-2,4,6-triisocyanate, polymethylenepolyphenyltriisocyanate and the like; tetraisocyanates such as 4,4'-dimethyldiphenylmethane-2,2',5,5'-tetraisocyanate and the like.

Adducts of these compounds can be prepared by reacting them with polyhydric compounds such as polyols, polyamines, or water in a known manner. In accordance with a preferred embodiment of this invention, the adduct includes an anionic or acidic moiety. Examples of anionic moieties are $OSO_3^-$, $OPO_3^=$, $COO^-$, $SO_2O^-$, $S_2O_3^-$, $POO^-$, and $PO_3^=$. Such functionalized isocyanates are generally prepared by reacting a compound having a pendant acid or hydroxy or amino group with a polyvalent isocyanate or isothiocyanate. One such compound is 4-sulfophthalic acid sodium salt. This compound can be reacted with a polyvalent isocyanate such as hexamethylenediisocyanate or the like to produce a compound having a plurality of reactive isocyanate groups and a sulfonato group. Other useful compounds are sulfonated polyvalent compounds having labile hydrogen atoms such as sulfonated dicarboxylic acids, sulfonated polyols, etc. One sulfonated polyvalent isocyanate is commercially available from Mobay Corp. under the tradename Desmodur DA.

Also useful as pre-wall formers in the present invention are cyanoacrylates and isocyanatoacrylates.

When a cyanoacrylate pre-wall reactant is selected, it preferably of formula (I)

where R is an alkyl group, an alkenyl group, an alkynl group, an aryl group, an aralkyl group or a group of the formula (II)

where $R^3$ is a straight or branched chain alkylene group having 1 to 10 carbon atoms; R4 is an alkyl group, an alkenyl group, an alkynl group, an aryl group, an aralkyl group, an acryloyl group, a methacryloyl group, a cyanoacryloyl group, or $R^4$ is a moiety containing 2 to 4 isocyanato groups; and $R^1$ and $R^2$ may be the same or different and each represents a hydrogen atom, an alkyl group having 1 to 10 carbon atoms, 2-furyl, 2-thienyl, or 3-thienyl.

Examples of alkyl groups represented by R include methyl, ethyl, propyl, etc.; examples of alkenyl groups include butenyl, propenyl, and 1,3-pentadienyl; examples of alkynyl groups include propynyl and isobutynyl.

Cyanoacrylates may be prepared by reacting cyanoacetic acid with a diol to yield a hydroxyester. The hydroxyester is reacted with an acid chloride or an acid anhydride in the presence of sulfuric acid to yield a compound of the formula (III)

where $R^3$ and $R^4$ are defined as above. This compound is reacted with the ketone of the formula (IV)

$$R^1-\overset{\overset{\displaystyle O}{\|}}{C}-R^2 \qquad (IV)$$

in the presence of ammonium acetate and toluene to yield the compound of formula (I) where R is defined as in formula (II). The bis-cyanoacrylate can be synthesized from cyanoacetic acid and a diol to yield the compound (V)

$$NCCH_2\overset{\overset{\displaystyle O}{\|}}{C}OR^3O\overset{\overset{\displaystyle O}{\|}}{C}CH_2CN \qquad (V)$$

which is subsequently reacted with a ketone to yield the biscyanoacrylate. Alternatively, cyanoacrylates can be synthesized by the procedures described in the literature, for example U.S. Pat. Nos. 3,850,960; 4,012,402; 3,975,422; 4,003,942; 4,013,703; 4,041,061; 4,041,062; 4,041,063; and Japan published application 80/100351. A review of the synthesis of biscyanoacrylates is given in G. H. Millet, "Structural Adhesives," S. R. Hartshorn Ed., Ch. 6, p. 542 (1986), Plenum Press.

Examples of other cyanoacrylates which may be used in the present invention are set forth in U.S. Pat. Nos. 2,721,858; 2,794,788; 2,763,585; 3,221,745; and 2,753,251. Also contemplated within the scope of the present invention are other activated acrylates wherein the cyano group is replaced by other reactive groups such as trifluoromethyl, aldehyde, ketone, ester, carboxyl, nitromethyl and phenyl groups.

When an isocyanatoacrylate pre-wall reactant is selected, it is preferably of formula (VI)

$$(C=C-\overset{\overset{\displaystyle O}{\|}}{C}-O)_m-R^1-(NCO)_n \qquad (VI)$$

wherein $R^1$ is an alkylene group, an arylene group, an arylenealkylene group or a polyether group and m and n independently represent 1, 2 or 3. Examples of suitable isocyanatoacrylates of formula (III) include isocyanatoethylacrylate, isocyanatoethylmethacrylate, and a condensate of 2-hydroxyethyl(meth)acrylate with a polyisocyanate.

The internal phase preferably also includes a diisocyanate or polyisocyanate compound in addition to the cyanoacrylate or isocyanatoacrylate pre-wall reactant.

The use of the aforesaid isocyanates, isothiocyanates, cyanoacrylates, etc., is not limited except that they are added to the hydrophobic oily liquid prior to the emulsification. They are added in an amount of about 0.005 to 15 parts per 100 parts of the hydrophobic oily liquid and preferably about 0.01 to 10 parts.

Functionalized isocyanates may be used alone or in combination with the non-functionalized isocyanates listed above in certain embodiments of the invention. In certain embodiments of the invention it may be desirable to use a mixture containing 10 to 100% of the functionalized isocyanate.

Chain extenders useful in this invention are polyfunctional compounds which are soluble in the aqueous phase, reactive with the pre-wall former, have a high affinity toward the internal phase so that they can diffuse efficiently to the interface and react, and be essentially non-reactive with other components of either the internal or external phases. Examples of some preferred chain extenders are melamine and its methylol derivatives; polyamines such as ethylenediamine, diethylenetriamine, triethylenetetraamine; polyols such as sorbitol, glycerine, N,N,N',N'-tetrakis (2-hydroxyethyl) ethylene diamine; amino acids such as lysine, glutamine; and amino alcohols such as Galactosamine, 2-amino-2-ethyl-1,3-propanediol, 2-(2-aminoethylamino) ethanol, 1-(aminoethyl)-4-hydroxybenzyl alcohol, 1,3-diamino-2-hydroxy propane.

In general, the chain extender is incorporated in the aqueous phase in a fraction of stoichiometric amount or up to about 3 times a stoichiometric amount based on the pre-wall former. Synergistic effects may be achieved by incorporating several chain extenders in the aqueous phase. Since some chain extenders are soluble in both the aqueous and oil phases, synergistic effects may also be achieved by using the chain extender of this invention with those described in copending application U.S. Ser. No. 07/450,709. However, in doing so, it is preferred to use different chain extenders in the two phases to establish enough concentration gradient between the two phases, and in turn, facilitate the reaction at interface.

It is preferred to use an anionic, cationic or nonionic surface active agent in emulsifying and dispersing the hydrophobic oily liquid because it accelerates the emulsification and prevents coagulation. Typically, the surface active agent is used in an amount of about 0.03 to 6% by weight, preferably 0.1 to 2% by weight, based on the hydrophobic oily liquid.

The surfactant is preferably a water-soluble anionic polymer, a water-soluble nonionic polymer, or a water-soluble amphoteric polymer. The solution of the surfactant prepared in the process generally will have a concentration of about 0.5 to 20 wt % of the hydrophobic oily liquid to be encapsulated, the hydrophobic oily liquid is in turn dispersed in the aqueous solution in an amount of about 1 to 60 wt % and the concentration for the aqueous solution of urea, melamine and/or formaldehyde is 0.2 to 40 wt %, preferably 1 to 20 wt %, based on the hydrophobic oily liquid.

Any natural or synthetic anionic polymer, e.g., polymers containing $-COO^-$, $-SO_3^-$ or like groups, can be used as a surfactant. Examples of such natural polymers are gum arabic and alginic acid. Examples of semi-synthetic anionic polymers are carboxymethyl cellulose, phthalated gelatin, sulfated starch, cellulose sulfate, and lignin sulfonic acid. Synthetic anionic polymers which can be used in this invention include maleic anhydride based copolymers (including those copolymers hydrolyzed), acrylicacid based homopolymers and copolymers (including methacrylic acid based homopolymers and copolymers), vinyl-benzenesulfonic acid based homopolymers and copolymers, and carboxy modified polyvinyl alcohols.

In a preferred embodiment of the invention, the internal phase is dispersed in a solution of pectin and sulfonated polystyrene (surfactant). Typical examples of sulfonated polystyrenes useful in the present invention are Versa TL500, Versa TL502B and Vessa TL503, products of National Starch Co. Useful sulfonated polystyrenes are generally characterized by a sulfonation degree of over 85% and preferably over 95%. The molecular weight of the sulfonated polystyrene is preferably greater than 100,000 and more preferably about 500,000 but other molecular weights can also be used. The sulfonated polystyrene is usually added to the aqueous phase in an amount of about 1 to 6% by weight. The quality of this product has also been found to vary with the method by which it is manufactured such that certain sulfonated polystyrenes are better than others.

Emulsification is preferably conducted under conditions which afford an emulsion having an average particle size in the range of about 2.5 to 5.0 microns. The observed particle size of the emulsion is somewhat smaller than the particle size of the capsules produced. Typically, the emulsion is prepared by adding an oily material to be encapsulated to an aqueous phase containing pectin and sulfonated polystyrene while stirring or otherwise agitating the aqueous phase to achieve the desired emulsion particle size. The aqueous phase may also include other capsule wall forming materials in a manner well known in the art.

The capsule wall can be formed around the oil droplets in the emulsion using many known wall forming techniques.

The present invention is particularly directed to forming microcapsules in which the oily core material is enwrapped in an amine-formaldehyde condensation product. Such microcapsules are formed by in situ condensation of formaldehyde and an amine such as urea, melamine, dimethylol urea, and the like, or a pre-condensate thereof. The condensation product can be modified by the co-condensation of a polyhydric phenol such as resorcinol if desired.

Microcapsules can be prepared by forming an aqueous phase containing pectin and Versa TL502B, and adjusting the pH to suit the condensation reaction to be employed, followed by the addition of the oil phase. Generally, a pH of about 4.0 is useful in making urea-formaldehyde microcapsules whereas a pH of 6.0 is used in making melamine-formaldehyde microcapsules. To assist in dissolving the pectin, a small amount of sodium bicarbonate may be added to the pectin. This also acts as a buffer and improves ionic strength and thereby improves wall building characteristics. Upon dissolution, carbon dioxide is generated and the bubbles help to break up the pectin.

Blending is continued until an average emulsion particle size of about 3.5 microns has been achieved whereupon solutions of the amine and formaldehyde or a solution of a precondensate thereof are/is added to the emulsion and the capsule walls gradually form.

Among many well known encapsulation techniques that can be used in the present invention are: Kiritani et al, U.S. Pat. No. 3,796,669 for urea-resorcinol-formaldehyde capsules; Forris et al, U.S. Pat. Nos. 4,001,140, 4,087,376 and 4,089,802 for melamine-formaldehyde capsules. The present invention can be practiced using the aforesaid techniques by incorporating pectin and sulfonated polystyrene prior to emulsification of the oil.

One process of this invention comprises fundamentally the following steps:

1. Preparing an aqueous solution of a chain extender compound and a water-soluble polymer. In preparing microcapsules with a urea-formaldehyde capsule wall, the urea may be added to the aqueous solution at this stage.

2. Emulsifying and dispersing the hydrophobic oily liquid to be encapsulated (to which a polyvalent isocyanate, a polyvalent isothiocyanate, a prepolymer thereof, cyanoacrylate, etc., has been added) in the aqueous solution prepared in Step (1).

3. Adding an aqueous solution of melamine and formaldehyde or a precondensate thereof to the emulsion prepared in Step (2) in the case of forming melamine-formaldehyde capsule walls, and adding formaldehyde and optionally urea to the emulsion of Step (2) when forming urea-formaldehyde capsule walls.

4. Forming the capsule walls by raising the temperature of the resulting mixture while controlling the pH value and stirring, whereby the melamine and formaldehyde or urea and formaldehyde are polycondensed.

The condensation reaction proceeds under neutral or acid conditions, e.g., pH of 7 or less; however, the reaction is preferably carried out at a pH in the range of 2.5 to 6.0. The temperature of the encapsulation medium should be maintained at about 10° to 95° C., preferably about 25° to 85° C. and more preferably about 45° to 75° C.

Among the acid catalysts that may be used are low molecular weight carboxylic acids, e.g., sulfuric acid, hydrochloric acid, phosphoric acid, etc.; and acidic or easily hydrolyzable salts such as aluminum sulfate, ammonium nitrate, ammonium chloride, ammonium sulfate, etc. Ammonium salts are preferred as they seem to provide a stronger and less permeable capsule. The ammonium salts are usually employed in an amount of about 2 to 20% by weight based on the amount of urea.

The amine and formaldehyde are preferably present in the encapsulation medium, whether as the free monomer or a precondensate, in a molar ratio of formaldehyde to amine of at least 1.5 and preferably about 2.0 to 5.0.

To reduce malodor and the incidence of skin irritation, when the polymerization reaction is complete, it is desirable to remove or react the excess formaldehyde. This can be accomplished by using any one of several known techniques such as the addition of phosphoric acid, urea, sulfite or bisulfite. These materials react with the formaldehyde to form a product which is easily removed from the medium. The addition of the urea or sodium sulfate to scavenge formaldehyde is preferably made in a single step after encapsulation and prior to storage. The pH and temperature of the medium should be adjusted for this reaction. The sulfite is preferably reacted at a pH of 6 to 8 at room temperature for about 2 hours. The urea can be reacted at a pH of 3 to 12 at a temperature of 30° to 80° C. for ½ to 4 hours.

Suitable polyhydric phenols that may be added to the reaction system for co-condensation with the amine and formaldehyde to improve impermeability are resorcinol, catechol, gallic acid, and the like. The phenols may be added in an amount of 5 to 30% by weight based on the amount of urea.

The process of the present invention is advantageously used to produce microcapsules which may be provided on a paper or film support for use in photographic or pressure-sensitive recording papers. In the former embodiment, the core material is typically a substantially colorless color former dissolved in an oil. In the latter embodiment, the core material is typically a photohardenable composition containing a color former. U.S. Pat. Nos. 4,399,209 and 4,772,541 disclose photosensitive record sheets which may be prepared using the present invention.

The invention is illustrated in more detail by the following non-limiting examples:

EXAMPLE 1

1. The following internal phase composition was prepared and preheated to 90° C. to enhance dissolution of the dye precursor.

| | |
|---|---|
| TMPTA (trimethylolpropane triacrylate) | 150 g |
| Photoinitiator | 0.9 g |
| DIDMA (diisopropyldimethyl aniline) | 1.5 g |
| Yellow dye precursor | 18 g |
| Desmodur N-100 | 10 g |

The chain extender and the amount in which it was used are shown in Table 1.

2. The continuous phase was prepared in ambient condition as follows:

Sample 1 (Control)

8 g Versa TL502B was dissolved in 430 g water by stirring at 500 rpm for 15 minutes or more and 12.65 g pectin was dry blended with 0.24 g sodium bicarbonate and dissolved into the water phase by stirring at 1500 rpm for 105 minutes or more. The pH was then adjusted by dropwise addition of NaOH (4.8% solution) to pH 6.0.

Sample 2

2 g of melamine was mixed with 8 g Versa and then dissolved in 430 g water. The rest of procedure is the same as for Control described above.

3. Emulsification

The external continuous phase containing Versa TL502B and pectin was brought to 3000 rpm mixing and the internal phase material (oil) was added into the mixing continuous phase. Mixing was maintained at 3000 rpm for 15 minutes after oil phase addition.

4. Wall formation 246 g melamine-formaldehyde prepolymer aqueous solution was added to the emulsion while mixing at 1500 rpm and the pH was adjusted to pH 6.0 with $H_3PO_4$ (5% solution). The reaction mixture was covered and held at 70° for 1 hour while mixing at 1500 rpm. A solution of 46.2 g Urea @50% solution was added to the reaction mixture and reaction was allowed to continue at 70° C. for 40 minutes. (This step scavenges unreacted formaldehyde.) The stirring was adjusted to 500 rpm. The pH was adjusted to about 9.5 with NaOH (4.8% solution), the reaction vessel was covered and allowed to cool in ambient condition while mixing at 500 rpm.

TABLE 1

| Sample No. | | (Control) 1 | 2 |
|---|---|---|---|
| Melamine | | 0 | 2 |
| Dmax | 21°/45% | 2.10 | 2.13 |
| | 30°/80% | 1.76 | 2.03 |
| Dmin | 21°/45% | 0.10 | 0.10 |
| | 30°/80% | 0.16 | 0.13 |
| LogE10 | 21°/45% | 3.44 | 3.41 |
| | 30°/80% | 4.13 | 3.79 |
| LogE90 | 21°/45% | 2.87 | 2.87 |
| | 30°/80% | 3.53 | 3.08 |

Table 1 compares the photographic characteristics (Dmax, Dmin, toe speed (Log $E_{10}$), shoulder speed (Log $E_{90}$)) of materials stored for 2 hours at 21° C. and 45% RH with materials stored for 2 hours at 30° C. and 80% RH. The data show that the improved pre-wall Sample 2 has much better photographic characteristics (higher Dmax, lower Dmin, faster toe speed (smaller Log $E_{10}$), faster shoulder speed (smaller Log $E_{90}$)) than Sample 1 (Control) at high temperature/humidity (30° C./80% RH). Sample 2 has equivalent or better photographic characteristics at 21° C./45% RH. Sample 2 exhibits smaller changes in Dmax, Dmin, Log E10 and Log $E_{90}$ due to environmental changes (21° C./45% RH and 30° C./80% RH).

EXAMPLE 2

The formulation and procedure are the same as those described in Example 1, except that 1 g Sorbitol and 8 g Versa 502B were dissolved in 430 g water in the preparation of the continuous phase for the improved pre-wall.

TABLE 2

| Sample No. | | (Control) 1 | 2 |
|---|---|---|---|
| Sorbitol | | 0 | 1 |
| Dmax | 21°/45% | 2.09 | 2.14 |
| | 30°/80% | 1.80 | 1.86 |
| Dmin | 21°/45% | 0.10 | 0.11 |
| | 30°/80% | 0.15 | 0.14 |
| LogE10 | 21°/45% | 3.54 | 3.48 |
| | 30°/80% | 4.14 | 4.04 |
| LogE90 | 21°/45% | 2.95 | 2.94 |
| | 30°/80% | 3.44 | 3.35 |

Table 2 compares the photographic characteristics (Dmax, Dmin, toe speed (Log $E_{10}$), shoulder speed (Log $E_{90}$)) of materials stored for 2 hours at 21° C. and 45% RH with materials stored for 2 hours at 30° C. and 80% RH. The data show that the improved pre-wall Sample 2 has much better photographic characteristics (higher Dmax, lower Dmin, faster toe speed (smaller Log $E_{10}$), faster shoulder speed (smaller Log $E_{90}$)) than Sample 1 (Control) at high temperature/humidity (30C/80% RH). Sample 2 has equivalent or better photographic characteristics at 21° C./45% RH. Sample 2 exhibits smaller changes in Dmax, Dmin, Log E10 and Log $E_{90}$ due to environmental changes (21° C./45% RH and 30° C./80% RH).

Having described the invention in detail and by reference to preferred embodiments thereof, it will be apparent that modifications and variations are possible without departing from the scope of the invention defined in the appended claims.

What is claimed is:

1. A method for preparing microcapsules which comprises:

dispersing a hydrophobic oily liquid containing a pre-wall former in a continuous aqueous phase, wherein said pre-wall former is selected from the group consisting of a polyvalent isocyanate, a polyvalent isothiocyanate, a polyvalent isocyanate adduct, a polyvalent isothiocyanate adduct, a cyanoacrylate, an isocyanato acrylate, and a mixture of a polyvalent isocyanate and a sulfonated polyvalent isocyanate, said aqueous phase containing at least one water soluble chain extender which also has a high affinity toward said oily liquid, said chain extender selected from the group consisting of melamine, methylol derivatives of melamine, ethylenediamine, diethylenetriamine, triethylenetetraamine, sorbitol, glycerine, N,N,N',N'-tetrakis (2-hydroxyethyl) ethylenediamine, lysine, glutamine, glactosamine, 2-amino-2-ethyl-1,3-propanediol, 2-(2-amino-ethylamino) ethanol, 1-(aminoethyl)-4-hydroxybenzyl alcohol, and 1,3-diamino-2-hydroxy propane wherein said chain extender reacts with said pre-wall former upon dispersion of said hydrophobic oily liquid in said continuous aqueous phase to form a thick, non-permeable pre-wall surrounding the oil droplets; and forming capsule walls around the pre-wall coated droplets of said hydrophobic oily liquid in said continuous aqueous phase.

2. The method of claim 1 wherein said chain extender is selected from the group consisting of melamine, ethylenediamine, diethylenetriamine, triethylenetetraamine, sorbitol, glycerol and lysine.

3. The method of claim 2 wherein said chain extender is melamine, or sorbitol.

4. The method of claim 3 wherein said microcapsule walls are formed by forming in situ an amine-formaldehyde condensation product.

5. The method of claim 4 wherein said condensation product is a melamine-formaldehyde condensation product.

6. The method of claim 1 wherein said pre-wall former is a polyvalent isocyanate or a mixture of a polyvalent isocyanate and a sulfonated polyvalent isocyanate.

7. The method of claim 6 wherein said pre-wall former is a mixture of a polyvalent isocyanate and a sulfonated polyvalent isocyanate.

8. The method of claim 1 wherein said continuous aqueous phase contains a water soluble anionic polymer dissolved therein.

9. The method of claim 8 wherein said water soluble anionic polymer is a homopolymer or a copolymer of vinyl benzene sulfonic acid.

10. The method of claim 1 wherein said hydrophobic oily liquid is a photohardenable composition.

11. The method of claim 1 wherein said continuous aqueous phase further contains an anionic, cationic, or nonionic surface active agent.

12. The method of claim 11 wherein said surface active agent is a sulfonated polystyrene.

13. A method for forming melamine-formaldehyde microcapsules which comprises:
dispersing a hydrophobic oily liquid containing a pre-wall former in a continuous aqueous phase to form a dispersion, wherein said pre-wall former is selected from the group consisting of a polyvalent isocyanate, a polyvalent isothiocyanate, a polyvalent isocyanate adduct, a polyvalent isothiocyanate adduct, a cyanoacrylate, an isocyanato acrylate, and a mixture of a polyvalent isocyanate and a sulfonated polyvalent isocyanate, said aqueous phase containing at least one water soluble chain extender which also has a high affinity toward said oily liquid, said chain extender selected from the group consisting of melamine, methylol derivatives of melamine, ethylenediamine, diethylenetriamine, triethylenetetraamine, sorbitol, glycerine, N,N,N',N'-tetrakis (2-hydroxyethyl) ethylenediamine, lysine, glutamine, glactosamine, 2-amino-2-ethyl-1,3-propanediol, 2-)2-amino-ethylamino) ethanol, 1-(aminoethyl)-4-hyeroxybenzyl alcohol, 1,3-diamino-2-hydroxy propane wherein said chain extender reacts with said pre-wall former upon dispersion of said hydrophobic oily liquid in said continuous aqueous phase to form a thick, nonpermeable pre-wall surrounding the oil droplets; and
adding aqueous solutions of melamine and formaldehyde or an aqueous solution of a prepolymer thereof to said dispersion to form a melamine-formaldehyde condensate which enwraps the pre-wall coated oily particles forming said dispersion to form microcapsules.

14. The method of claim 13 wherein said chain extender is selected from the group consisting of melamine, sorbitol, glycerol, ethylenediamine, diethylenetriamine, triethylenetetraamine, and lysine.

15. The method of claim 14 wherein said chain extender is melamine or sorbitol.

16. The method of claim 1 wherein said pre-wall former is a polyisocyanate or a mixture of a polyisocyanate and a sulfonated polyvalent isocyanate.

17. The method of claim 16 wherein said pre-wall former is a mixture of a polyisocyanate and a sulfonated polyisocyanate.

18. The method of claim 13 wherein said continuous aqueous phase contains a water soluble anionic polymer dissolved therein.

19. The method of claim 18 wherein said water soluble anionic polymer is a homopolymer or a copolymer of vinyl benzene sulfonic acid.

20. The method of claim 13 wherein said hydrophobic oily liquid is a photohardenable composition.

21. The method of claim 13 wherein said continuous aqueous phase further contains an anionic, cationic, or nonionic surface active agent.

22. The method of claim 21 wherein said surface active agent is a sulfonated polystyrene.

* * * * *